United States Patent [19]

Shumaker et al.

[11] Patent Number: 5,650,059
[45] Date of Patent: Jul. 22, 1997

[54] METHOD OF MAKING CEMENTED CARBIDE SUBSTRATE

[75] Inventors: Carl Shumaker; Zane D. Lockhart, Jr.; Oscar H. Miller, all of Louisville, Ky.

[73] Assignee: Credo Tool Company, Woodburn, Oreg.

[21] Appl. No.: 514,233

[22] Filed: Aug. 11, 1995

[51] Int. Cl.$^6$ ................... C25F 3/00; C25F 3/16
[52] U.S. Cl. ................... 205/640; 205/660; 205/664; 205/674; 205/684; 205/685; 216/74
[58] Field of Search ................... 205/640, 660, 205/664, 674, 684, 685; 216/74

[56] References Cited

U.S. PATENT DOCUMENTS

| | | |
|---|---|---|
| 324,945 | 8/1885 | Lucas . |
| 336,568 | 2/1886 | Jackson . |
| 2,073,678 | 3/1937 | Broughton . |
| 2,361,492 | 10/1944 | Pare . |
| 2,721,488 | 10/1955 | Eaton . |
| 2,736,312 | 2/1956 | Goldman . |
| 3,110,579 | 11/1963 | Benson et al. . |
| 3,122,030 | 2/1964 | Metzger . |
| 3,133,533 | 5/1964 | Sprague . |
| 3,162,187 | 12/1964 | Christensen . |
| 3,788,182 | 1/1974 | Tyler . |
| 4,234,333 | 11/1980 | Ghandehari et al. ........... 205/684 X |
| 4,406,759 | 9/1983 | Saitoh ........... 205/664 X |
| 4,690,024 | 9/1987 | Chaconas . |
| 4,710,279 | 12/1987 | Hozer ........... 205/664 |
| 4,727,778 | 3/1988 | Omi . |
| 4,731,296 | 3/1988 | Kikuchi et al. . |
| 4,784,033 | 11/1988 | Hayden et al. . |
| 4,990,403 | 2/1991 | Ito . |
| 5,040,436 | 8/1991 | Pfaltzgraff . |
| 5,213,667 | 5/1993 | Hozer ........... 205/664 |
| 5,236,740 | 8/1993 | Peters et al. . |

*Primary Examiner*—Donald R. Valentine
*Attorney, Agent, or Firm*—Middleton & Reutlinger; Charles G. Lamb

[57] ABSTRACT

A carbide substrate including a binder prepared to receive a cutting material such as a diamond coating thereon. The substrate is immersed in an electrolyte solution with the substrate acting as the anode thereby providing for an electro-polished substrate surface. The electro-polished substrate surface is then etched to substantially remove the binder phase of the carbide substrate, the etching being to a depth of up to about 15 microns. The resulting surface is susceptible for receiving a coating of the diamond cutting material.

19 Claims, 8 Drawing Sheets

ENERGY DISPERSIVE X-RAY ANALYSIS OF THE SURFACE OF AN OM3 CARBIDE SAMPLE AFTER ELECTROPOLISHING. NOTE STRONG COLBOLT Kα PEAK

ENERGY DISPERSIVE X-RAY ANALYSIS OF THE SURFACE OF THE ELECTROPOLISHED OM3 SAMPLE AFTER LEACHING TO REMOVE COBALT.

SUPERPOSITION OF DATA FROM THE ELECTROPOLISHED SAMPLE (SOLID CURVE) AND LEACHED SAMPLE (DOT CURVE).

5,650,059

METHOD OF MAKING CEMENTED CARBIDE SUBSTRATE

BACKGROUND OF THE INVENTION

1. Field of the Invention

The present invention relates to diamond coated cemented carbide substrates used as inserts on cutting tools, which substrates have a surface susceptible to receive diamond coatings thereupon, and a method of preparing the surface of the cemented carbide substrate.

2. The Prior Art

For many years, the cutting tool art has struggled to find a repeatable way to utilize artificial diamond imbedded inserts on cutting tools to enhance the performance thereof.

Generally, artificial diamond is of two varieties, polycrystalline diamond (PCD) and chemical vapor deposition (CVD) diamond film. PCD cutting tools, comprising a piece of polycrystalline diamond fastened to the tip of a tool insert are known in the art. However, these tools are expensive to manufacture and do not readily lend themselves to indexing for increased tool life. In addition, PCD inserts for tooling having complex shapes, i.e., taps, drill bits, router bits and the like, cannot be formed using known techniques.

Consequently, numerous attempts have been made to provide diamond coated cutting tools using a chemical vapor deposition (CVD) process to deposit a coating or film upon a carbide substrate, such as tungsten carbide (WC), to provide a cutting tool with increased cutting performance. There has long been interest in inserts of CVD diamond-coated carbide substrate, because such an insert would be less costly to manufacture than a PCD insert, and because inserts of a CVD diamond-coated carbide substrate would be available in more complex shapes than with PCD tool inserts.

Sintered tungsten carbide (WC) substrates without cobalt (Co) or other binders have been studied but can be too brittle to perform satisfactorily as cutting tool inserts. A good discussion of the prior art may be found in U.S. Pat. No. 5,236,740, which discloses a technique for applying CVD diamond film to unpolished cemented carbide substrates. As explained therein, a significant challenge to the developers of diamond-coated tooling is to optimize adhesion between the diamond film and the substrate to which it is applied, while retaining sufficient surface toughness in the finished product. Cemented tungsten carbide substrates incorporating a cobalt (Co) binder in concentrations equal to or less than 6% (WC/Co) have the requisite toughness and thus show the greatest long-term commercial promise for tooling applications. A cemented tungsten carbide substrate with up to 6% cobalt would provide adequate surface toughness for most machining and cutting tasks. Cemented tungsten carbide can be formed into a variety of geometries, making it a potential material for cutting tool inserts. To date, however, a repeatable, reliable CVD diamond coated cemented carbide substrate with repeatable cutting performance has escaped the art.

It is therefore a goal to provide a cemented tungsten carbide substrate which may be effectively and reliably coated with a layer of CVD diamond film having adequate adhesion to the substrate for use as an insert on a machine or cutting tool. However, the solution to the problem of adequate, consistent and reliable adhesion of CVD diamond films to cemented carbide substrates has long eluded the art.

It has been reported in the literature that the use of a cobalt binder in cemented carbides inhibits adhesion of the diamond film to the substrate. R. Haubner and B. Lux, *Influence of the Cobalt Content in Hot-Pressed Cemented Carbides on the Deposition of Low-Pressure Diamond Layers*, Journal De Physique, Colloque C5, supplement no 5, pp. C5-169-156, Toma 50, May 1989. Indeed, conventional wisdom indicates that successful use of cemented tungsten carbide substrates may only be achieved by utilizing substrates containing no cobalt, as taught in U.S. Pat. No. 4,990,403; or no more than 4% Co binder, as taught in U.S. Pat. No. 4,731,296, or by deliberately depleting the cobalt concentration at the surface of the substrate. It is known to deplete the cobalt concentration at the surface of the substrate by selective etching or other methods. M. Yagi, *Cutting Performance of Diamond Deposited Tool for Al 18 mass % Si Alloy*, Abst. of 1st Int. Conf. on the New Diamond Sci. & Technol, pp. 158–159, Japan New Diamond Forum 1988. However, this decreases the surface toughness of the substrate and can cause chipping of the substrate and applied diamond film. Increased adhesion of diamond to the substrate may be achieved by decarburizing the substrate prior to deposition, as taught in European Patent Application Publication No. 0 384 011, but use of this procedure does not optimize substrate toughness and does not lend itself well to manufacturing environments where repeatability and consistency are important issues.

Some aspects of the prior art speculate that polishing or scratching the surface of a cemented tungsten carbide substrate prior to attempting diamond deposition may achieve improved adhesion of CVD diamond film, claiming there is an enhancement to the nucleation process caused by scratching and polishing. Haubner and Lux; Yagi; M. Murakawa et al., *Chemical Vapour Deposition of A Diamond Coating Onto A Tungsten carbide Tool Using Ethanol*, Surface Coatings Technology, Vol 36. pp. 303–310. 1988; Kuo et al. *Adhesion and Tribological Properties of Diamond Films on various substrates*, J. Mol. Res. Vol. 5, No. 11, November 1990, pp. 2515–2523. However, examination of these articles confirm that use of polished substrates yields poor results obtained by utilizing substrates whose surfaces have not been prepared by polishing or scratching.

Another attempted solution to the adhesion problem has been to employ an interlayer between the diamond and a WC/Co substrate. This encapsulates the Co, optimizing adhesion while allowing the substrate to retain its toughness. It may also be possible to choose an effective interlayer material that bonds strongly to diamond further increasing adhesion. U.S. Pat. No. 4,707,384 discloses use of a titanium carbide interlayer. U.S. Pat. Nos. 4,998,421 and 4,992,082 disclose utilization of a plurality of layers of separated diamond or diamond like particles interposed with layers of a planarized bonding material. However, to date these technologies have not been demonstrated to be commercially repeatable or viable.

Those skilled in the cutting tool art realize that the adhesion problem is particularly acute for cemented carbide cutting tools, and even more acute when the tool is intended to cut wood, especially man-made wood-like products such as particle board, fibre board and the like, because the carbide surface must be ground and/or polished to exacting dimensions to provide a keen or sharp (i.e., cutting) edge. Until now, no process or technique was effective or viable on a commercially repeatable basis for carbide substrates used for cutting tool inserts where the cutting edge of the carbide substrate was ground/polished. It has been discovered that the grinding/polishing process produces a film or "skin" on the surface of the cemented carbide substrate of undetermined morphology, which makes the adhesion of a CVD film, such as a diamond film, difficult and nonuniform, even when the substrate is acid-etched as the prior art teaches. It is believed that acid etching of cemented carbide surfaces is not effective on carbide substrates which have a "skin" because an etchant strong enough to penetrate/remove the "skin" also has the effect of corroding the carbide grains in a manner which renders the carbide grains ineffective as nucleating sites for the deposited CVD film. The present invention solves this long-standing problem, to provide a cemented carbide substrate very receptive to CVD diamond film, as shown by the cutting performance of inserts made according to the present invention.

SUMMARY OF THE INVENTION

According to the present invention, a cemented carbide substrate, such as tungsten carbide which uses a cobalt or nickel based binder at up to six percent by weight of the substrate, or a binder of a cobalt-based or a nickel-based alloy at up to six percent by weight, is prepared to receive a coating with a layer of CVD diamond film by subjecting the substrate surface to be coated to a process which first electro-polishes the substrate surface, which appears to remove the "skin" that is left by mechanical grinding/polishing of the substrate. Such mechanical grinding/polishing is necessary to impart a keen cutting edge to the substrate. The electro-polished substrate is then subjected to an acid etchant process which removes cobalt from a portion of the cemented carbide surface to a depth of up to about 15 microns, preferably about 1–5 microns. The "skin"-free and cobalt-free surface of the cemented tungsten carbide substrate is thereby rendered particularly susceptible to an adherent CVD coating of diamond film.

As presently preferred, an acceptable surface of the carbide body of the present invention is achieved by means of a two step process. The first step of the process is an electro-polishing step which is carried out by immersing the carbide body (substrate) in an electrolytic bath, connecting the carbide body (substrate) to an electrical circuit wherein the carbide body (substrate) acts as the anode connected via a power source to a cathode (e.g., stainless steel), and then subjecting the substrate to a selected current density for a predetermined time. The second step of the inventive process is etching the surface of the electro-polished cemented carbide with a selected etchant such as, for example, an inorganic acid or combination of inorganic acids, in concentrated or diluted form with distilled water, or oxidizing agents such as hydrogen peroxide ($H_2O_2$), or the like for a predetermined time. As presently preferred, the etching solution will include about one part hydrochloric acid (HCl), about one part solution containing 3% by weight hydrogen peroxide in distilled water, and two parts distilled water. Other mixtures may be used to control the rate and uniformity at which the cobalt is leached from the carbide surface. The effectiveness of this process may be enhanced by one or more cleaning steps with an anhydrous alcohol/acetone solution interposed before, between and/or after the above two steps.

The electrolyte solution used in the electro polishing step is generally a sodium hydroxide (NaOH) solution wherein the concentration of sodium hydroxide is about 10%. Those skilled in the art will realize that other electrolyte solutions may be used, including but not limited to that described above. When using an anhydrous alcohol/acetone bath, the mixture is not critical; alcohol of about fifty percent (50%) and acetone of about fifty percent (50%) has proven satisfactory.

Cemented tungsten carbide substrates made according to the present invention have been successfully and uniformly coated with CVD diamond film, such success being measured by the resistance of cutting tools containing CVD-diamond coated tungsten carbide inserts produced according to the present invention to the Rockwell "C" indentation hardness test, and further demonstrated by cutting performance of the cutting tools containing CVD-diamond coated tungsten carbide inserts produced according to the present invention on medium density particle board (MDPB).

DESCRIPTION OF THE FIGURES

Reference to one or more of the following Figures will aid in the understanding of the present invention.

DESCRIPTION OF A PREFERRED EMBODIMENT

Those of ordinary skill in the art will realize that the following description of the present invention as set forth in the following examples is illustrative only and not in any way limiting. Other embodiments of the invention will readily suggest themselves to such skilled persons.

EXAMPLE 1

Figure 1:
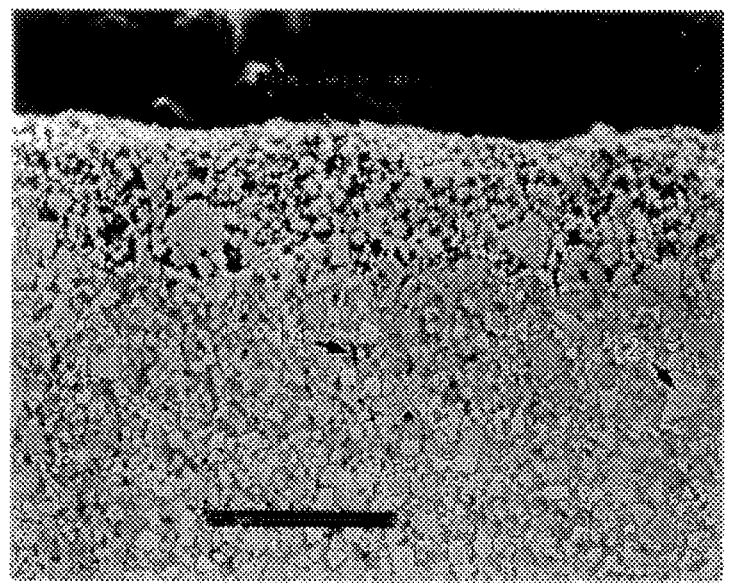
FIG. 1 is a photomicrograph of a cross-section of a cemented carbide substrate made according to the present invention at a magnification of 2140×.
Figure 3:
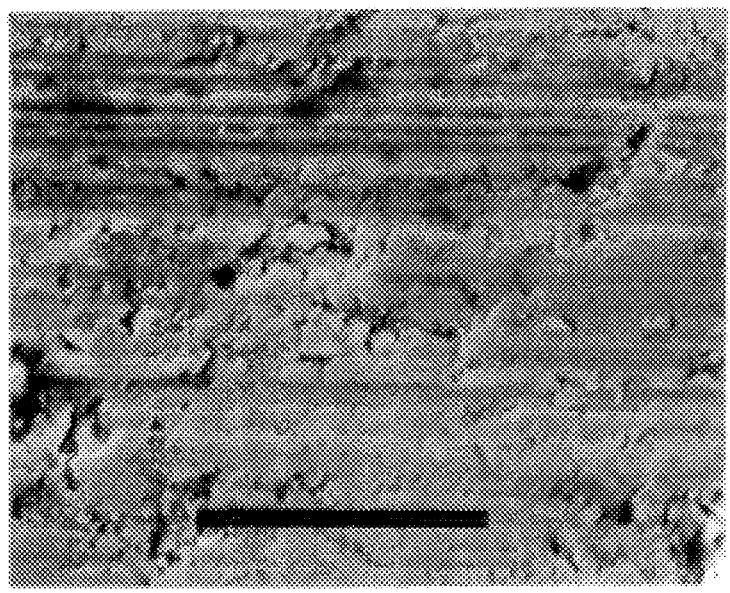
FIG. 3 is a photomicrograph of a portion of the surface of a cemented carbide substrate which has been ground/polished to provide a keen (i.e., cutting) edge, showing the presence of the "skin" resulting from grinding/polishing (at 7500×)

Referring to FIG. 1, a cross-section of the article of the present invention is shown as a carbide substrate, after being subjected to the novel surface preparation procedure of the present invention. In this example a substrate of Vermont American's OM3 grade tungsten carbide/cobalt (4.5% Co by weight) having a ground cutting edge was used. Reference to FIG. 3 shows that the grinding procedure, which is what gives the substrate its keen or cutting edge (and also provides relief in a known manner) leaves a characteristic series of grooves on the smoothly ground surface. As is further noted, the ground surface has a "skin" of complex morphology, wherein the WC carbide grains cannot be distinguished from the Co grains even though FIG. 3 is shown at 7500×. This "skin" is usually present to a depth of several microns, or about equal to the depth of the grinding grooves. The "skin" has been found quite difficult to remove through known etching techniques.

FIG. 1 shows the article of the WC/Co substrate of the present invention after it has been made according to the novel process set forth herein, which both removes the "skin" and presents a multi-layered structure. Persons skilled in the art will recognize that the sub-surface layer of the substrate is comprised of sharp-edged WC grains 12 cemented together by a cobalt binder 14. FIG. 1 reveals the upper-most layer, about 10 microns, of the substrate is free of cobalt binder 14, yet the angular edges of the WC grains have not been affected. Such a multi-layered WC/Co carbide substrate having an upper substantially cobalt-free layer of up to about 15 microns, presently preferably about 1–5 microns, wherein the carbide grains 12 exhibit angular sharp grain edges and a WC/Co layer adjacent and underneath the first layer, has been found particularly susceptible to receive a chemically-deposited coating such as a CVD diamond film.

Figure 4:
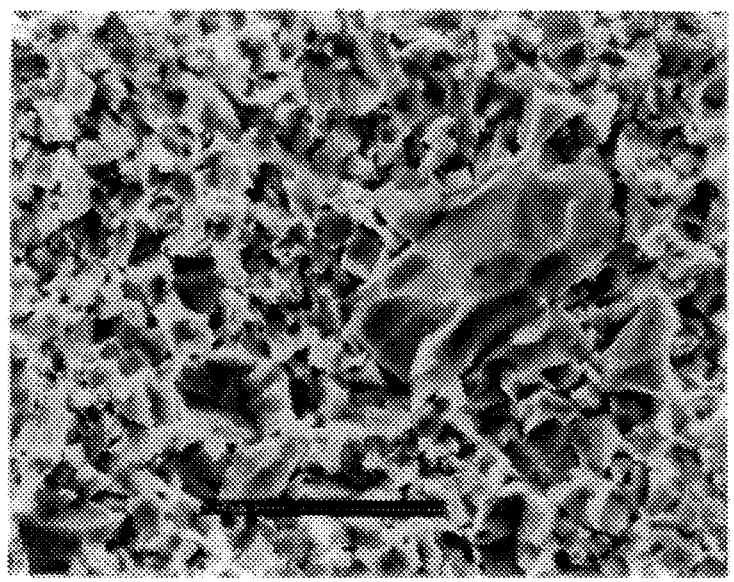
FIG. 4 is a photomicrograph at 7500× of the surface of a ground/polished cemented carbide substrate after 15 seconds of electro-polishing.
Figure 5:
FIG. 5 is a photomicrograph at 7500× of the surface of a ground/polished cemented carbide substrate after 30 seconds of electro-polishing.
Figure 6:
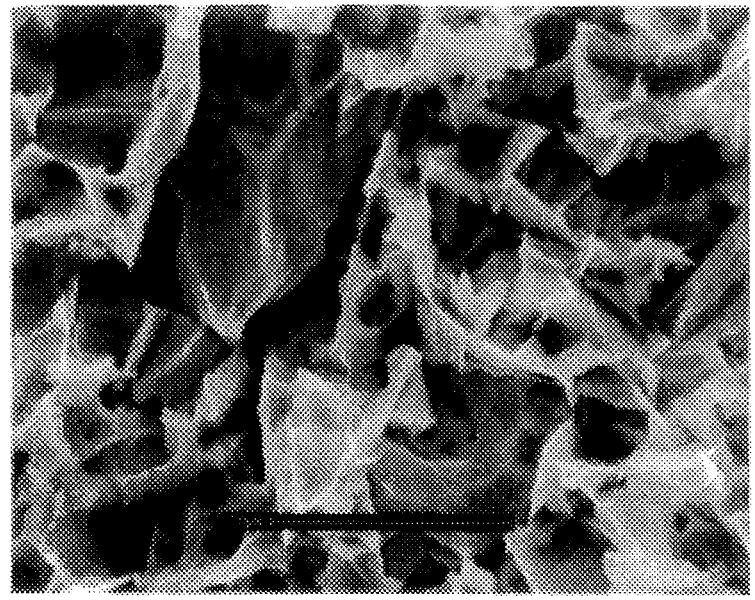
FIG. 6 is a photomicrograph at 7500× of the surface of a ground/polished cemented carbide substrate after one minute of electro-polishing.
Figure 9:
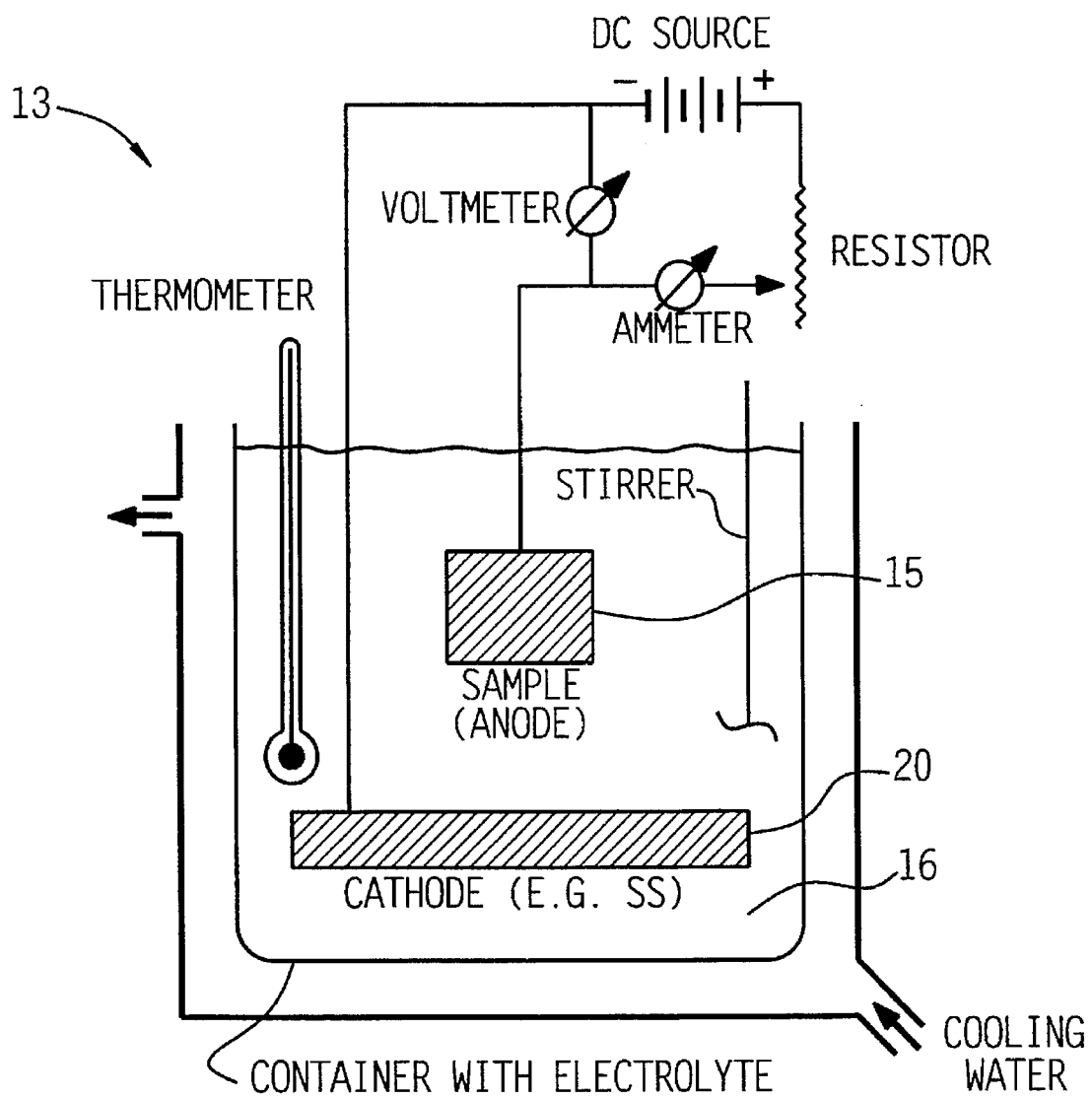
FIG. 9 is a schematic depiction of a carbide substrate undergoing electro-polishing.

The surface of the inventive WC/Co substrate was made as follows:

First the ground WC/Co substrate may be and preferably is cleaned with an anhydrous mixture of alcohol and acetone for a period of several minutes, presently preferably about five minutes, at ambient temperatures. Then the WC/Co substrate was electro-polished according to the following procedure (for ease of understanding reference may be made to FIG. 9, depicting the electro-polishing process), which has been found to remove disturbed metal (e.g., the "skin" of the ground surface) and sub-surface material from the WC/Co substrate as part of an electrolytic cell 13, as follows: the WC/Co carbide substrate 15 is fully or partially immersed in a suitable electrolyte 16, such as a 10% sodium hydroxide solution. The carbide substrate 15 is electrically connected to the negative terminal of, for example, a variable DC power supply 18 that acts as the anode of the cell. The positive power supply terminal is electrically connected to a cathode plate 20 placed between the electrolyte 16 and the carbide anode 15. The cathode plate 20 is typically stainless steel. A current is then applied to the cell 13 until a vigorous chemical reaction is observed at the anode surfaces of the carbide substrate 15. Current densities of $0.1 A/cm^2$ to $0.6 A/cm^2$ have been successfully employed with potentials not exceeding 20 volts. The vigorous electrochemical reaction produces an acceptable surface wherein the WC grains and the Co binder are distinguishable as they were prior to grinding. The impact of electro-polishing is quite rapid, as shown in FIGS. 3, 4 and 5. FIG. 3 shows the surface of the WC/Co substrate after only 15 seconds of electro-polishing. It is seen that the WC grains and Co binder are now distinguishable. FIGS. 4 and 5 show that after 30 seconds and 60 seconds (one minute) respectively, the WC grains and cobalt binder are increasingly detectable, as more of the "skin" is removed. While an acceptable electro-polished surface can be produced in as short as 15 seconds, at present an electro-polishing time of about 2 to 15 minutes at ambient temperature (about 25° C.) produces the most desirable results.

After electro-polishing the ground surface of the carbide substrate 15 as just described, the electro-polished substrate 15 may be and preferably is subjected to an intermediate anhydrous alcohol/acetone bath for several minutes, presently preferably about five minutes at ambient temperatures. The presently preferred anhydrous bath contains about a 50—50 mixture of alcohol (methanol or ethanol) and acetone.

Then, the ground and electro-polished surface of the carbide substrate 15 is subjected to an acid etchant for a period of about 30 seconds to four minutes, at ambient temperature. This etching step removes the cobalt binder 14 from the ground and electro-polished surface to a depth of up to about 15 microns, as shown in FIG. 1, with about 1 to 5 microns being presently preferred, without corroding the WC grains 12. The presently preferred etchant is one part hydrochloric acid, one part hydrogen peroxide (3% strength) and two parts distilled water. Such a mixture adequately removes cobalt to desired depth while at the same time retaining the integrity and angularity of WC grains, which is believed to present optimal nucleation sites to promote increased adherence of a CVD diamond film. Other etchants such as Murakami's reagent would likely produce acceptable results.

Finally, the electro-polished and etched carbide substrate 15 may be and preferably is immersed in a final anhydrous alcohol/acetone bath for several minutes, presently preferably about five minutes, at ambient temperature.

While the foregoing procedure has been described as preferably utilizing anhydrous alcohol/acetone baths before electro-polishing, between electro-polishing and etching and after etching, it has been observed WC/Co substrates subjected to only the electro-polishing and etching steps exhibit an acceptable surface to receive deposited coatings such as CVD diamond film. And, although the electro-polishing step has been described as taking place at ambient temperatures, the rate of polishing may be increased by raising the temperature of the electrolyte solution 16. In such a case, it may be necessary to subject the cell 13 to cooling means, such as shown in FIG. 9.

A carbide substrate according to the present invention just described has proven susceptible to receiving CVD diamond film to a thickness of up to about 100 microns, with good integrity of the CVD diamond film.

EXAMPLE 2.

Figure 2:
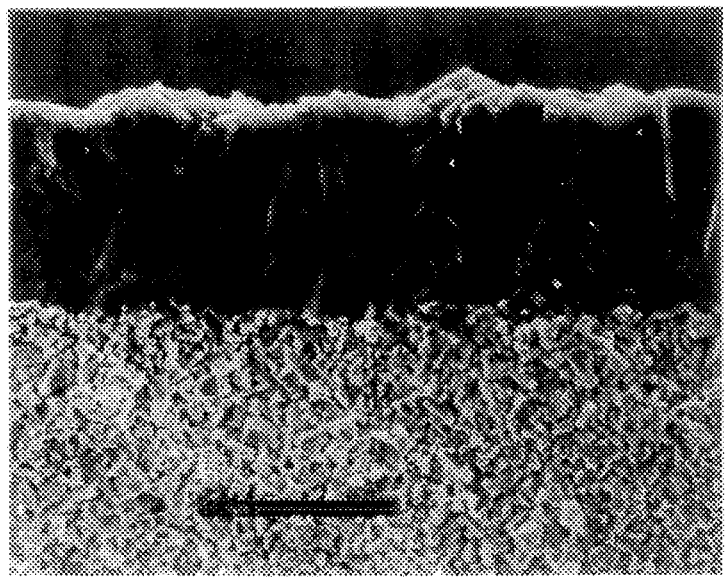
FIG. 2 is a photomicrograph of a cross-section of a cemented carbide substrate made according to the present invention showing a film of CVD diamond deposited thereon, at a magnification of 2250×.

Referring to FIG. 2, there is shown a WC/Co carbide substrate, in this case also Vermont American's grade OM3 (4.5% Co by weight) having a ground (keen) edge which has been made according to the just-described process and then coated with a CVD diamond film, which in FIG. 2 is about 16 microns thick. Reference to FIG. 2 reveals that the surface of the carbide substrate has been rendered substantially free of cobalt binder 14 to a depth of about 5 microns and that the WC grains 12 retained their angularity.

Figure 10:
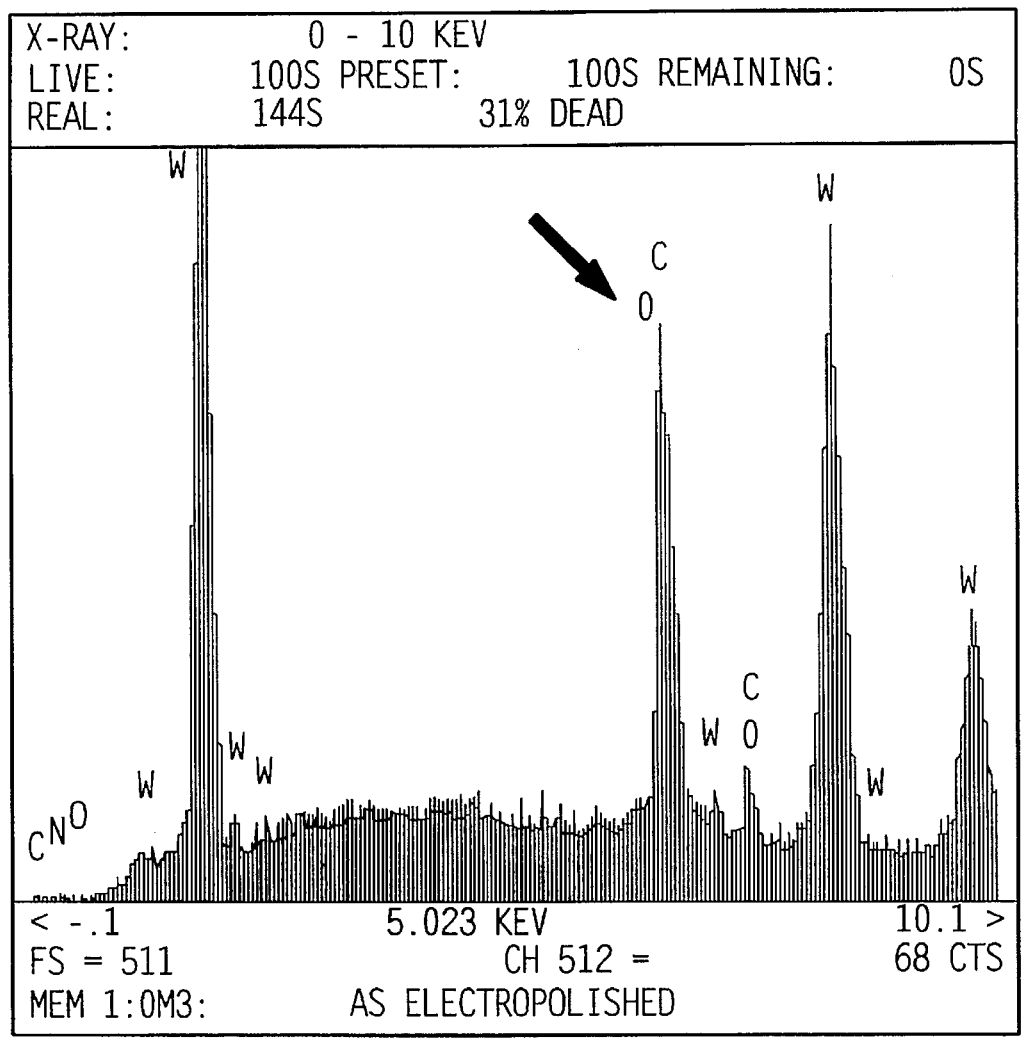
FIG. 10 is a graph showing X-ray spectroscopic analysis of the surface of a ground/polished cemented carbide substrate after electro-polishing.
Figure 11:
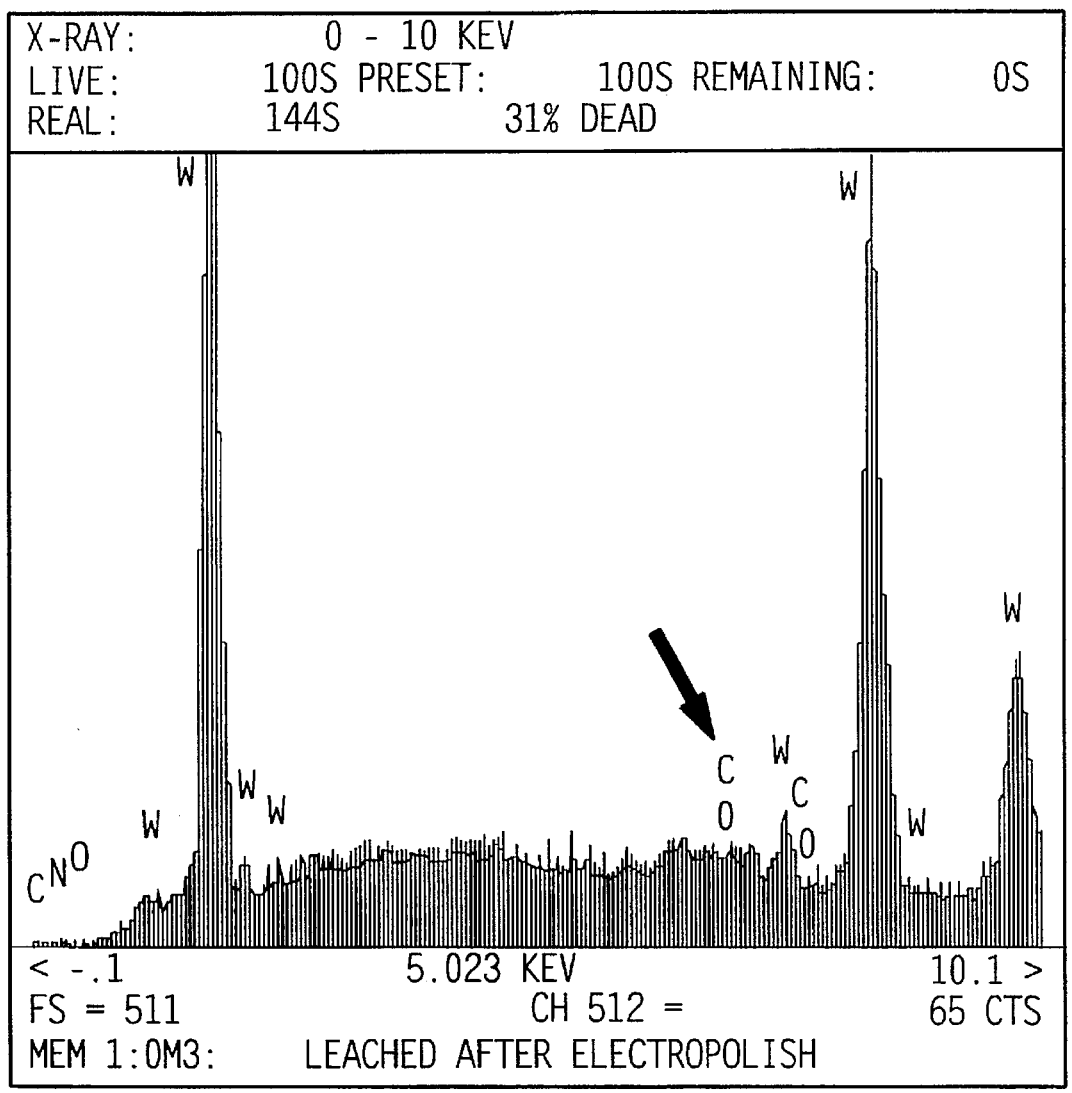
FIG. 11 is a graph showing X-ray spectroscopic analysis of the surface of a ground/polished cemented carbide substrate made according to the present invention.
Figure 12:
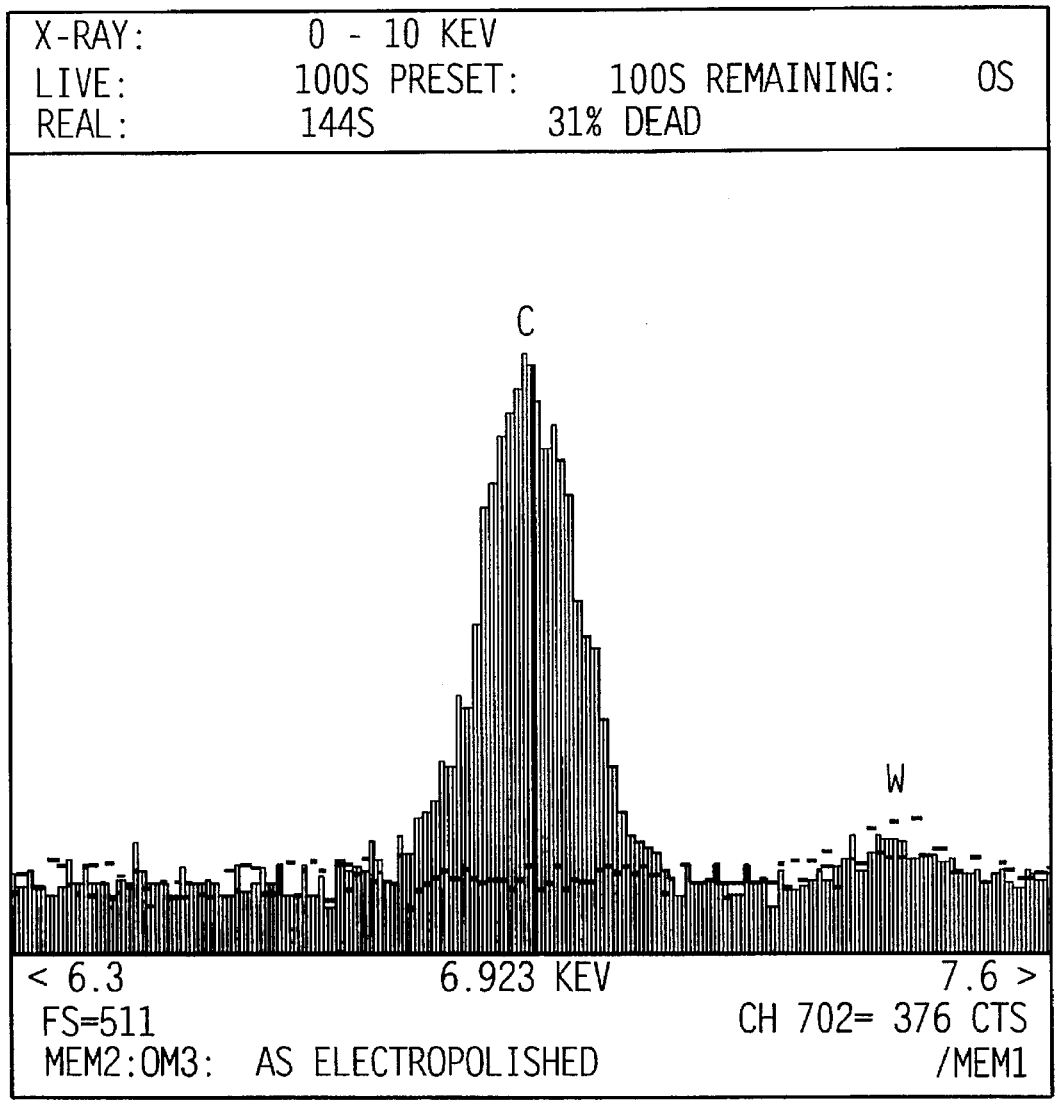
FIG. 12 is a comparison of FIGS. 10 and 11.

Reference to FIGS. 10, 11 and 12 shows the difference between an electro-polished surface of a WC/Co substrate and the same surface which has been electro-polished and acid etched according to the present invention described above. FIG. 10 is an X-ray spectroscopic analysis of the keen (ground) surface of an electro-polished surface of WC/Co carbide substrate 10 prior to, and FIG. 11 shows an X-ray spectroscopic analysis of the same surface after, the acid etch step of the just-described procedure. FIG. 12 is a comparison of FIGS. 10 and 11 for the electro-polished surface of the same substrate before and after acid etching.

Note that the electro-polished carbide surface (dotted graph) shows the presence of a cobalt $K_\alpha$ peak, but the electro-polished and etched surface (shaded area) show no activity of the $K_\alpha$ peak associated with the presence of cobalt. As can be seen, prior to the acid etch procedure there is a substantial amount of cobalt present, even after electro-polishing, as revealed in the presence of the distinctive $K_\alpha$ peak related to the presence of cobalt; and after being subjected to the acid etch step the substantial absence of cobalt at the electro-polished surface is indicated by virtually no spectroscopic activity at the known $K_\alpha$ peaks for cobalt.

Figure 7:
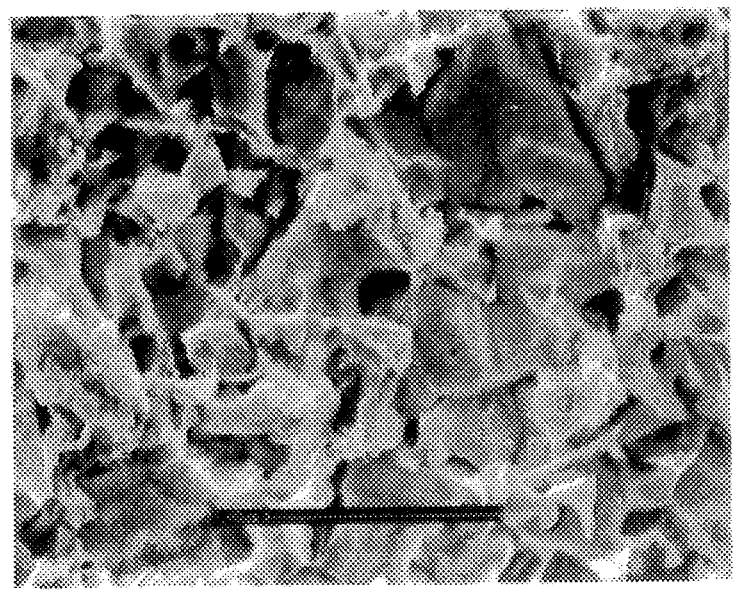
FIG. 7 is a photomicrograph at 6000× of the surface of a ground/polished cemented carbide substrate after one minute of electro-polishing and one minute of acid etching.

Reference to FIG. 7 reveals the surface of a WC/Co substrate of the present invention which has been subjected to only one minute each of electro-polishing and etching as described above. The surface is characterized by the presence of only angular WC carbide grains 15, and only traces of cobalt 14 remain. This will provide acceptable sites for nucleation with a chemically deposited film such as CVD diamond, the minor amount of cobalt 14 not being deleterious to effective deposition. Nevertheless, as shown in FIG. 1, the presently preferred article of the present invention is one which has been electro-polished in an electrolyte solution (10% NaOH+ distilled water) for about 10-12 minutes and then etched with a mixture of one part hydrochloric acid, one part hydrogen peroxide solution (3% strength) and two parts distilled water for about one minute, with an anhydrous alcohol/acetone bath before the WC/Co substrate is electro-polished (~five minutes), after electro-polishing (~five minutes), and after etching (~five minutes). FIG. 1 shows a substantial and virtual absence of cobalt to a depth of about 10 microns, rendering such surface particularly amenable to receiving a chemically deposited coating such as CVD diamond film. Thinner binder-free zones are preferable (about 1 to 5 microns), but in some cases thicker zones are acceptable.

FIG. 2 shows the article of the present invention including a WC carbide substrate as in FIG. 1 which has been coated with about 16 microns of CVD diamond film 22 by a known CVD deposition technique. Note that the interface between the diamond film 22 and the angular WC carbide grains 12 shows good and uniform bonding, even at 2250×. The effectiveness of the CVD diamond/WC carbide interface is further established by the resistance of the CVD-diamond coated surface to the Rockwell "C" indentation test. CVD-diamond coated carbide substrates as shown in FIGS. 1 and 2 survive the 60 kg indentation test using a Rockwell "C" indentor with only minimal spalling of the CVD-diamond film. Further evidence of the effectiveness of the article of the present invention for receiving a chemically-deposited coating such as a CVD diamond film, is shown by cutting with tool inserts using carbide substrates of the present invention (FIG. 1) which have been coated with CVD-diamond film (FIG. 2). Inserts as described have survived more than 10,000 feet of cutting medium density particle board (MDPB) with the integrity of the interface of the CVD-diamond coating and the WC carbide grains still fully intact, and with virtually no wear of the CVD-diamond coating at the cutting surface.

EXAMPLE 3

Figure 8:
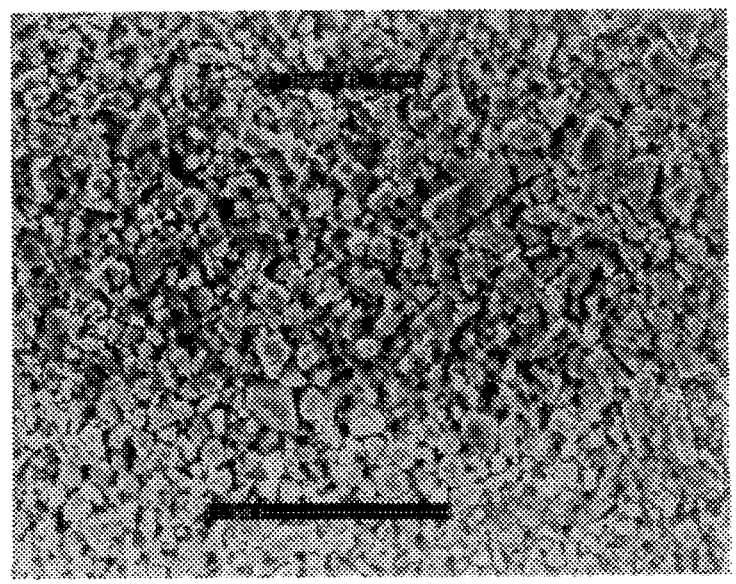
FIG. 8 is a photomicrograph at 3000× of the surface of a ground/polished cemented carbide substrate which has not been electro-polished but has been over etched resulting in corroded carbide grains.

FIG. 8 shows the surface of a WC/Co carbide substrate, Vermont American's grade OM3 (4.5% Co by weight), which has not been subjected to electro-polishing. This carbide substrate was subjected to acid etching with a solution of aqua regia for five minutes, the amount of time to sufficiently remove the "skin" and also render the surface cobalt-free in the manner according to the prior art. As can be seen, the WC grains are substantially corroded. While the surface is substantially depleted of cobalt, it has been found that a carbide surface of this type does not accept chemically deposited coatings, such as CVD diamond film, in an acceptable or repeatable manner. While the reason why a carbide surface such as shown in FIG. 8 does not receive CVD diamond film acceptably are not fully understood, it is believed that the corroded or "rounded" WC grains shown in FIG. 8 do not serve as effective nucleating sites for the chemically deposited film. Of course, appropriate initial nucleation is important to the strength and integrity of the carbide/CVD diamond interface. A carbide substrate as in FIG. 8 and coated with CVD diamond film exhibits poor resistance to the Rockwell C indentation test, with notable cracking and spalling of the CVD diamond coating. Also, cutting performance of CVD diamond coated cutting inserts made with carbide substrates as shown in FIG. 8 exhibit poor, and erratic, cutting performance of MDPB. The CVD diamond coating has a tendency to spall off, even without wear at the cutting edge.

While embodiments and applications of this invention have been shown and described, it would be apparent and obvious to those skilled in the art that many modifications other than those mentioned are possible without departing from the inventive concept herein described. The invention, therefore, should not be restricted in scope except within the spirit of the appended claims.

We claim:

1. A method of making a cemented carbide substrate having a carbide phase and a binder phase and including at least one cutting edge ground thereon and a cutting surface susceptible to receiving a coating of cutting material, said method comprising the steps of: immersing said substrate in an electrolyte solution with said substrate acting as the anode of said electrolytic solution and a power supply acting as the cathode of said electrolytic solution to electro-polish said substrate to provide a cutting surface of said cutting edge; and etching said electro-polished surface of said substrate to substantially remove the binder phase of said carbide to a depth of up to about 15 microns beneath the surface of said substrate.

2. The method of claim 1, wherein said etching of said electro-polished surface substantially removes the binder phase of said carbide to a depth of 1 to 5 microns beneath the surface of said substrate.

3. The method of claim 2, said electrolyte solution being 10% by weight of sodium hydroxide.

4. The method of claim 2, said electro-polishing including immersing said substrate in said electrolyte solution from about 15 seconds to about 15 minutes.

5. The method of claim 2, said etching including immersing said substrate in an etching solution selected from the group comprising nitric acid, hydrochloric acid, sulfuric acid, hydrogen peroxide, and mixtures thereof.

6. The method of claim 5, said etching solution being a mixture of hydrochloric acid, hydrogen peroxide and water.

7. The method of claim 6, said water being distilled water.

8. The method of claim 2 including the step of immersing said substrate in a solution comprised of an anhydrous alcohol.

9. The method of claim 8, said immersing said substrate in a solution comprised of an anhydrous mixture of alcohol and acetone being performed either before said electro-polishing step, between said electro-polishing step and said etching step, or after said etching step.

10. The method of claim 8, said water being distilled water.

11. The method of claim 9 wherein said electro-polishing takes place at elevated temperatures.

12. The method of claim 8, said immersing of said substrate in said solution comprised of an anhydrous mixture of an alcohol and an acetone being at about 25° C. for a period of about 5 minutes.

13. The method of claim 2 including the step of immersing substrate in a solution comprised of a mixture of anhydrous alcohol and anhydrous acetone.

14. A method of preparing the surface of a cemented carbide substrate comprising the steps of:

immersing said substrate in a solution comprised of an anhydrous mixture of alcohol and acetone for about two to five minutes at ambient temperature;

electro-polishing the surface of said substrate by connecting said substrate as the anode of an direct current electrolytic cell comprising an electrolyte solution of 10% sodium hydroxide and distilled water and a cathode of stainless steel and subjecting said substrate to a current density of between about 0.1 A/cm$^2$ to 0.6 A./cm$^2$ at an electric potential of up to about 20 volts for a period of time between about 15 seconds and 15 minutes at ambient temperature;

immersing said electro-polished substrate in a solution comprised of an anhydrous mixture of alcohol and acetone for about two to five minutes at ambient temperature;

etching said substrate with a solution comprising about one part hydrochloric acid, about one part solution of hydrogen peroxide in distilled water, and two parts distilled water for between 30 seconds and five minutes at ambient temperature; and immersing said substrate in a solution comprised of an anhydrous mixture of alcohol and acetone for about two to five minutes at ambient temperature.

15. The method of claim 14 wherein said solution of hydrogen peroxide in distilled water contains about three percent by weight of hydrogen peroxide..

16. The method of claim 14 wherein each said step of immersing said article in a solution comprised of an anhydrous mixture of alcohol and acetone is for about five minutes.

17. The method of claim 14 wherein said article is electro-polished as the anode of said electrolytic cell in said 10% sodium hydroxide electrolyte solution for about 2 to 15 minutes.

18. The method of claim 14 wherein said article is etched for about one minute.

19. The method of claim 14 wherein said electro-polishing takes place at elevated temperatures.

* * * * *